US012174253B2

(12) United States Patent
Moreira et al.

(10) Patent No.: US 12,174,253 B2
(45) Date of Patent: Dec. 24, 2024

(54) BIAS GENERATOR TESTING USING GROUPED BIAS CURRENTS

(71) Applicant: NXP B.V., Eindhoven (NL)

(72) Inventors: Cristian Pavao Moreira, Frouzins (FR); Thierry Mesnard, Plaisance du Touch (FR); Michiel Alexander Hallie, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/124,406

(22) Filed: Mar. 21, 2023

(65) Prior Publication Data

US 2023/0333161 A1 Oct. 19, 2023

(30) Foreign Application Priority Data

Apr. 14, 2022 (EP) ..................................... 22305546

(51) Int. Cl.
*G01R 31/3183* (2006.01)
*G01R 31/319* (2006.01)

(52) U.S. Cl.
CPC ..................... *G01R 31/3183* (2013.01); *G01R 31/31924* (2013.01)

(58) Field of Classification Search
None
See application file for complete search history.

(56) References Cited

U.S. PATENT DOCUMENTS

| 4,340,904 | A | * | 7/1982 | Wingrove, Jr. | ........ | H04N 9/645 |
| | | | | | | 348/657 |
| 5,751,141 | A | * | 5/1998 | Sachdev | ............ | G01R 31/3008 |
| | | | | | | 714/733 |
| 6,768,685 | B1 | * | 7/2004 | Scheuerlein | ........... | G11C 29/34 |
| | | | | | | 365/201 |
| 8,152,305 | B2 | | 4/2012 | Carter et al. | | |
| 9,673,611 | B2 | | 6/2017 | Saloio, Jr. et al. | | |
| 2011/0069094 | A1 | | 3/2011 | Knapp | | |
| 2012/0081016 | A1 | | 4/2012 | Wu et al. | | |
| 2017/0205481 | A1 | | 7/2017 | Kim et al. | | |

FOREIGN PATENT DOCUMENTS

| CN | 103389768 B | * | 11/2015 | ..... H03K 19/018528 |
| CN | 109215729 A | * | 1/2019 | ........... G11C 11/161 |
| DE | 102013111873 A1 | * | 4/2014 | ......... G01R 31/3277 |
| EP | 1462769 B1 | | 5/2008 | |
| TW | 201809700 A | * | 3/2018 | ........ G01R 19/16538 |
| WO | WO-9704326 A1 | * | 2/1997 | ......... G01R 31/3004 |

* cited by examiner

*Primary Examiner* — Guerrier Merant (57) ABSTRACT

An electronic device includes a bias generator to generate a plurality of bias currents and a testing module to test the bias generator by successively testing each subset of bias currents of a plurality of subsets of bias currents grouped from the plurality of bias currents as a corresponding single test current. The testing module can include a variable resistor, wherein the testing module is to test the bias generator by, for each subset of bias currents, configuring the variable resistor to have a corresponding resistance based on the number of bias currents represented in the subset, conducting a corresponding test current through the variable resistor configured to the corresponding resistance, the test current representing a combination of all bias currents of the corresponding subset, and determining a test status for the subset of bias currents based on a voltage across the variable resistor resulting from the corresponding test current.

19 Claims, 5 Drawing Sheets

BIAS GENERATOR TESTING USING GROUPED BIAS CURRENTS

CROSS-REFERENCE TO RELATED APPLICATIONS

This application claims the priority under 35 U.S.C. § 119 of European Patent application no. 22305546.8, filed on 14 Apr. 2022, the contents of which are incorporated by reference herein.

BACKGROUND

Electronic systems, and particularly mixed analog/digital systems, often employ bias generators to supply bias currents to various functional circuit blocks. Such bias generators often are tasked to provide bias currents of different types, such as bandgap bias currents, proportional-to-absolute-temperature (PTAT) bias currents, Complementary to Absolute Temperature Currents (CTAT) bias currents, and the like. Moreover, a bias generator may be employed to provide multiple bias currents with different slopes so as to reduce circuit sensitivity to process, voltage, and temperature (PVT) variations. As a result, an integrated circuit (IC) or other electronic component may utilize numerous bias currents of different types and slopes.

Many safety-compliant implementations, such as systems employed in automotive or aeronautic systems, mandate frequent real-time monitoring of the bias generator and the voltages and bias currents generated therefrom. However, given the sheer number of bias currents often generated by a bias generator in such systems, it often can be difficult to adequately test the bias generator in a test period that is sufficiently short to avoid impacting the operating time or efficiency of the electronic system.

SUMMARY OF EMBODIMENTS

In accordance with one aspect, a method includes grouping a plurality of bias currents generated by a bias generator into a plurality of subsets, at least one subset having two or more bias currents of the plurality of bias currents, and testing the bias generator by successively testing each subset of bias currents as a corresponding single test bias current.

The method further can include one or more of the following features, individually or in combination. The method further can include for each subset of bias currents: configuring a variable resistor to have a corresponding resistance based on the number of bias currents represented in the subset; providing a corresponding test current to the variable resistor configured to the corresponding resistance, the test current representing a combination of all bias currents of the corresponding subset; and determining a test status for the subset of bias currents based on a voltage across the variable resistor resulting from conducting the corresponding test current. Determining the test status for the subset of bias currents can include: converting the voltage across the variable resistor to a corresponding test digital value; and determining the test status based on a comparison of the test digital value with at least one of a predetermined digital value or a predetermined range of digital values. Determining the test status for the subset of bias currents further can include identifying a failed test status responsive to at least one of the test digital value differing from the predetermined digital value by more than a specified threshold or exceeding the test digital value falling outside the predetermined range. Configuring the variable resistor to have a corresponding resistance can include configuring the variable resistor to have a resistance inversely proportional to the number of bias currents in the subset. Conducting the corresponding test current through the variable resistor can include conducting the corresponding test current from the bias generator to the variable resistor over a conductive bus used for other testing processes for a system having the bias generator. Providing the corresponding test current to the variable resistor further can include providing the corresponding test current from the bias generator to the variable resistor over a conductive bus used for other testing processes for a system having the bias generator. The method thus can further include generating the plurality of bias currents based on a plurality of drive voltages and testing the bias generator further by, for each drive voltage of at least a subset of the plurality of drive voltages, providing the drive voltage over the conductive bus to an input of an analog-to-digital converter (ADC), converting the provided drive voltage at the ADC to a corresponding test digital value, and determining a test status of the bias generator based on a comparison of the test digital value to at least one of predetermined digital value or a predetermined range of values. Each subset can have the same number of bias currents, or at least one subset can have a different number of bias currents than another subset.

In accordance with another aspect, a device includes a bias generator configured to generate a plurality of bias currents and a testing module configured to test the bias generator by successively testing each subset of bias currents of a plurality of subsets of bias currents grouped from the plurality of bias currents as a corresponding single test current.

The device further can include one or more of the following features, individually or in combination. The device further can include a variable resistor, and wherein the testing module is configured to test the bias generator by: for each subset of bias currents: configuring the variable resistor to have a corresponding resistance based on the number of bias currents represented in the subset; conducting a corresponding test current through the variable resistor configured to the corresponding resistance, the test current representing a combination of all bias currents of the corresponding subset; and determining a test status for the subset of bias currents based on a voltage across the variable resistor resulting from conducting the corresponding test current. The testing module can be configured to determine a test status for the subset of bias currents by: converting the voltage across the variable resistor to a corresponding test digital value; and determining the test status based on a comparison of the test digital value with at least one of a predetermined digital value or a predetermined range of values. The testing module can be further configured to determine a test status for the subset of bias currents further by identifying a failed test status responsive to at least one of the test digital value differing from the predetermined digital value by more than a specified threshold or the test digital value falling outside the predetermined range. The testing module can be configured to configure the variable resistor to have a corresponding resistance by configuring the variable resistor to have a resistance inversely proportional to the number of bias currents in the subset. The device further can comprise a conductive bus coupling the bias generator to the variable resistor, and wherein the bias generator is configured to generate the plurality of bias currents based on a plurality of drive voltages, and wherein the testing module is further configured to test the bias generator by: for each drive voltage of at least a subset of the plurality of drive voltages: receiving the drive voltage over the conductive bus at an input of an ADC of the testing module; converting the provided drive voltage at the ADC to a corresponding test digital value; and determining a test status of the bias generator based on a comparison of the test digital value to a predetermined digital value. Each subset can have the same number of bias currents, or at least one subset can have a different number of bias currents than another subset.

In accordance with yet another aspect, an electronic device includes a plurality of circuit blocks, a bias generator configured to provide a plurality of bias currents to the plurality of circuit blocks, and a testing module configured to perform a multi-stage test of the bias generator, the multi-stage test including a voltage test stage and a bias current test stage, wherein for the voltage test stage the testing module is configured to convert each drive voltage of a set of one or more drive voltages of the bias generator to a corresponding test digital value and determine a test status of the drive voltage based on a comparison of the test digital value to at least one of a predetermined digital value or a predetermined range of digital values, and wherein for the bias current test stage the testing module is configured to group a plurality of bias currents of the bias generator into a plurality of subsets, at least one subset having more than one bias current, and further configured to determine a corresponding test status for each subset by generating a test voltage for the subset using a single test current generated from the subset, the single test current representing a combination of all of the bias currents of the subset, and by comparing a test digital value generated from the test voltage with at least one of a predetermined digital value or a predetermined range of digital values. The electronic device further can include a bus comprising at least one conductive line, wherein the bias generator has an interface to the bus, the interface configurable to either provide a drive voltage of the bias generator to the bus or to provide the bias currents of a selected subset in parallel to the bus, and wherein the testing module has an ADC, a variable resistor, and a switch selectively coupling one terminal of the variable resistor to an input of the ADC, the input of the ADC further coupled to the bus, and wherein the switch is configured to connect the variable resistor to the input of the ADC for the bias current test stage and disconnect the variable resistor from the input of the ADC for the voltage test stage. Further, the circuit blocks can include circuit blocks of a radar device and the multi-stage test can be performed either prior to or following an operational radar transmit/receive stage using the circuit blocks.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Real-time, or during field operation, testing of a bias generator in an electronic system can negatively impact the functional efficacy of the electronic system depending on the duration needed to conduct such testing. For example, in an automotive millimeter wave (mmW) radar implementation, safety considerations often mandate performing safety functional checks of certain subsystems, including bias generators, for each transmit ("chirp") cycle of a radar device. As the radar device typically is unable to transmit or receive while this safety functional check is being conducted, the longer it takes to perform the safety functional test, the longer the transmit/receive cycle of the radar device needs to be, and thus the less frequently the mmW radar system can perform radar detection.

Conventionally, the testing process for the bias currents supplied by a bias generator involves testing each bias current in sequence. In a complex system in which many bias currents are generated by the bias generator, this sequential testing approach can require a significant amount of time to complete and thus impede efficient operation of the overall system since the time used for testing consequently is unavailable for radar detection operations. Accordingly, disclosed herein are systems and techniques for efficient bias current generation testing based on grouping of bias currents for testing. In at least one embodiment, a testing module configures the bias generator to supply a plurality of bias currents generated by the bias generator for testing by grouping subsets of the plurality of bias currents and sequentially testing the subsets of bias currents. In this approach, the bias currents of a given subset are combined into a single test current that is provided to a variable resistor to generate a test voltage across the resistor due to conduction of the test current through the variable resistor. The test voltage is converted to a test digital value, and this test digital value is compared to a specified, or predetermined, expected digital value for the test. If the test digital value is within a specified threshold of the expected digital value, the testing module identifies the test status for the corresponding subset of bias currents as "passed" and moves on to testing the next subset of bias currents in the same manner Otherwise, if the test digital value differs from the expected digital value by more than the threshold amount, the testing module identifies the test status for the corresponding subset of bias currents as "failed" and asserts a flag that is then acted upon by the system. As some or all of the subsets of bias currents include multiple bias currents, this grouping-based testing process can be conducted faster than an individual current testing process, and thereby provide for more rapid and efficient real-time safe operation testing.

Further, in some embodiments this grouping-based bias current testing approach can be integrated into a two-phase bias generator testing process. In many instances, a bias generator utilizes voltage-based current generators to generate the bias currents, and thus if a drive voltage used for current generation are out of specification, it is unlikely that the bias currents generated from the out-of-specification drive voltage are likely to be within specification. As such, the drive voltages of the bias generator can be a common cause of failure of the bias generator. Accordingly, the test process can include a first phase for common cause failure testing in which the drive voltages are provided in sequence to the testing module and tested using the same or similar components used to perform the group-based bias testing. In the event that a drive voltage is determined to exceed an acceptable operating range, then a flag can be asserted. Otherwise, if the tested drive voltages are deemed to within their corresponding acceptable operating ranges, then the testing module moves on to the second phase, in which the grouping-based bias current testing is performed as described above and herein.

Figure 1:
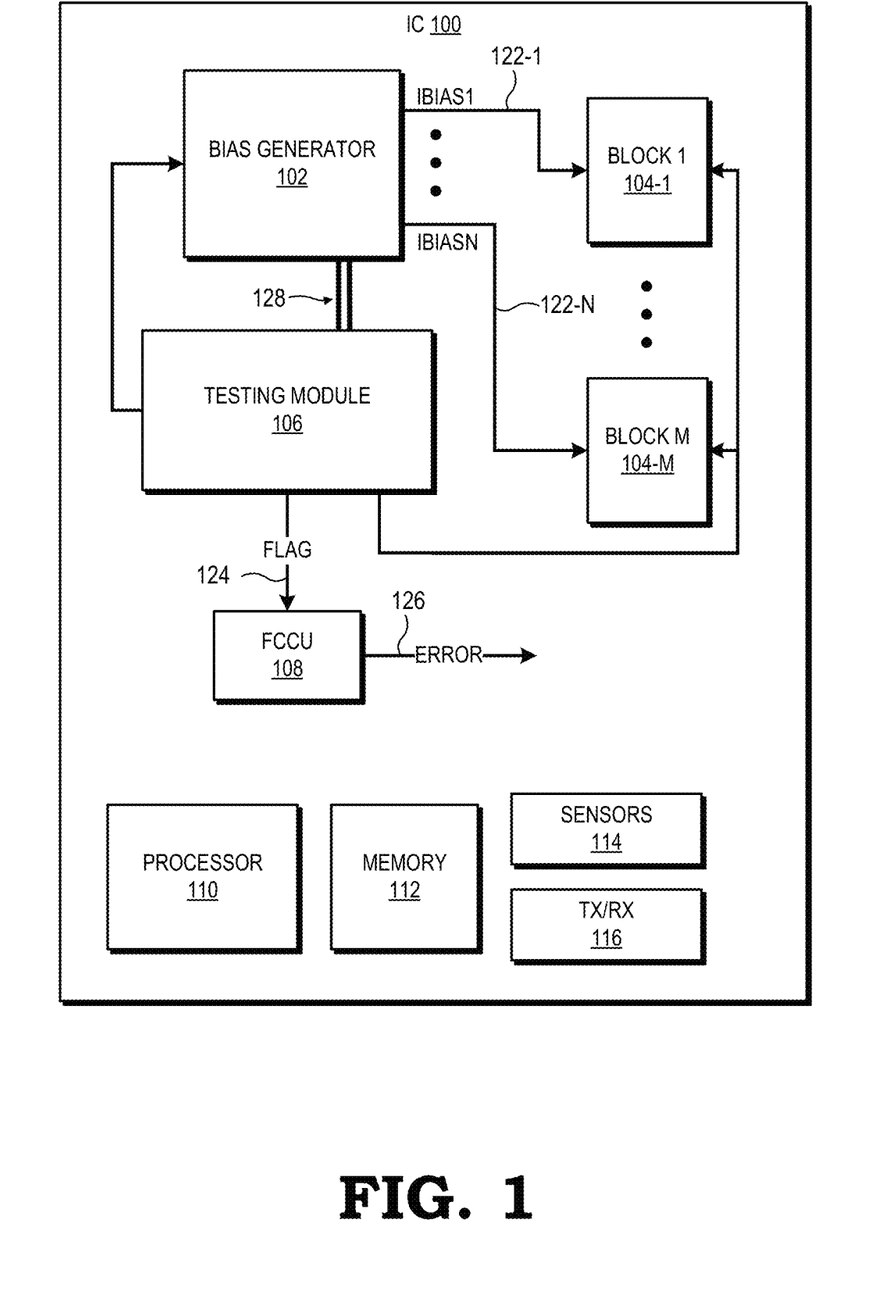
FIG. 1 is a block diagram of an electronic device implementing a bias generator testing process in accordance with some embodiments.

FIG. 1 illustrates an electronic device 100 employing current-grouping-based bias generator testing in accordance with some embodiments. In the illustrated example, the electronic device 100 is employed as an integrated circuit (IC) device, such as a system on a chip (SoC), and thus is also referred to herein as IC device 100. However, it will be appreciated that the electronic device 100 may employ multiple ICs, and thus reference to IC device 100 in the singular is also understood to extend to a multiple-IC implementation unless otherwise specified. In the depicted embodiment, the IC device 100 includes a bias current generator 102 (hereinafter, "bias generator 102" for brevity), a plurality of circuit blocks 104 (identified as circuit blocks 104-1 to 104-M, M>1), a testing module 106, and a fault collection and control unit (FCCU) 108. The IC device 100 further can include additional components for performing various operations, such as one or more processors 110, one or more memories 112, one or more sensors 114, transmitter (TX)/receiver (RX) components 116, and the like. The circuit blocks 104 comprise digital, analog, and/or mixed digital/analog circuitry, which may comprise circuitry of the components of the IC device 100, such as the sensors 114 and/or the TX/RX components 116.

The bias current generator 102 is configured to generate a plurality of bias currents 122 (identified as bias currents 122-1 to 122-N, or IBIAS1 to IBIASN, N>1) that are provided to the circuit blocks 104. Although FIG. 1 illustrates an example in which there is a one-to-one correspondence between generated bias current 122 and circuit block 104, it will be appreciated that in implementation some or all of the circuit blocks 104 may receive multiple bias currents from the bias current generator 102, and further the same bias current 122 may be supplied to multiple circuit blocks 104. The circuit blocks 104 utilize the received bias currents to bias various circuit components (e.g., operational-amplifiers (op-amps), mixers, low noise amplifiers, analog-to-digital converters (ADCs), digital-to-analog converters (DACs), analog or mixed analog-digital circuits, individual transistors, and the like). As such, the bias generator 102 may be configured to provide various types of bias currents for the circuit blocks 104, such as band-gap-based bias currents, PTAT-based bias currents, or CTAT bias currents, as well as to provide bias currents for a given type but with different slopes so as to facilitate reduced sensitivity to PVT variations.

The circuit blocks 104 may implement any of a variety of functions in which rapid bias generator testing would be advantageous or is required per specification or mandate. For example, the IC device 100 may implement some or all of the mixed analog and digital circuitry for an automotive radar system. Such systems may be subjected to certain standards for safety assurance, such as the International Organization for Standardization (ISO) 26262 standard, which specifies an Automotive Safety Integrity Level (ASIL) B that applies to automotive radar systems. ASIL B (as well as higher ASIL levels) requires in-field, or operational, safety checking of bias generators to ensure that the bias currents supplied to the receiving circuit blocks of the IC have the correct, expected input currents. As such, the testing module 106 and bias current generator 102 cooperate to test, or verify, the operation of the bias generator 102 based on this requirement or similar requirements in other contexts.

As described below in greater detail with reference to FIGS. 4-6, this testing process can employ a current-grouping bias test process in which, rather than testing each bias current 122 individually and sequentially, the testing module 106 instead groups the N bias currents 122 into a plurality of subsets, with some or all of the subsets having two or more bias currents 122, and then tests each subset of currents sequentially. In this approach, all of the bias currents 122 of a given subset under test are effectively "combined" into a single test current and this test current is then tested for compliance. If the test current is found to exceed a specified margin of error, then the testing module 106 issues a flag, such as flag 124, which is then analyzed by the FCCU 108 in conjunction with other considerations to determine whether an error 126 should be asserted. Otherwise, if the test current is found to be within the specified margin of error, the next subset is tested in the same manner, and this process continues until all indicated subsets have been tested. Moreover, in some embodiments, in addition to performing this current-grouping process as one testing stage, another testing stage can be performed to test other common cause failure modes of the bias generator 102, such as by testing the drive voltages generated by the bias generator 102 and used by the bias generator 102 in generating the bias currents 122. This two-stage test process is described below with reference to FIG. 3.

To facilitate testing of the bias generator 102, in at least one embodiment the testing module 106 is coupled to the bias generator 102 via a conductive bus 128, referred to herein as analog test bus (ATB) 128. The ATB 128 comprises one or more conductive lines (e.g., wires or traces) via which the test currents of the bias generator 102 and/or the test voltages of the bias generator 102 are tested at the testing module 106. In some embodiments, the ATB 128 is dedicated for bias generator testing only. In other embodiments, the ATB 128 is used for multiple testing procedures in the IC device 100, such as other built-in self-test (BIST) functions, such that the use of the ATB 128 for bias generator testing is only one of multiple uses of the ATB 128, thereby facilitating reuse of IC resources for different purposes.

Figure 2:
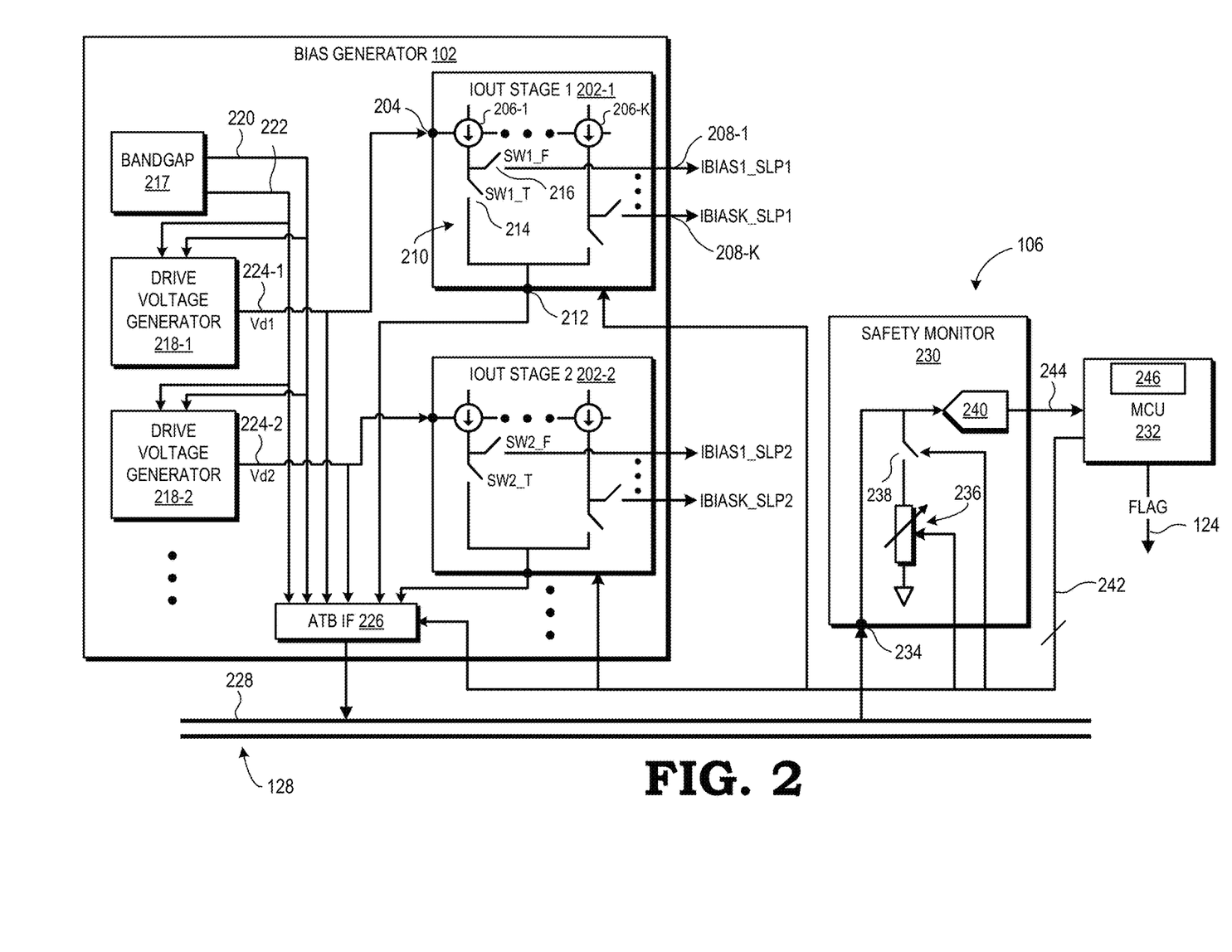
FIG. 2 is a block diagram illustrating a bias generator and testing module of the electronic device of FIG. 1 in accordance with some embodiments.

FIG. 2 illustrates an example implementation of the bias generator 102 and the testing module 106 in accordance with some embodiments. In the depicted example, the bias generator 102 includes a plurality of output current (IOUT) stages 202, such as the depicted output current stages 202-1 and 202-2. Although two output current stages 202 are illustrated, it will be appreciated that any number of output current stages 202 may be employed. Each output current stage 202 is configured to generate one or more bias currents based on a corresponding drive voltage, and thus includes an input 204 to receive the corresponding drive voltage (e.g., Vd1 for output current stage 202-1, Vd2 for output current stage 202-2, etc.) and one or more voltage-based current generators 206 (such as the illustrated voltage-based current generators 206-1 to 206-K, K>=1) configured to receive the input drive voltage and generate a corresponding bias current 208, such as the illustrated bias currents 208-1 to 208-K, also designated as bias currents IBIAS1_SLP1 to IBIAS1_SLPK for the output current stage 202-1 and bias currents IBIAS2_SLP1 to IBIAS2_SLPK for the output current stage 202-2. These bias currents 208 are embodiments of the bias currents 122 of FIG. 1. Each output current stage 202 further includes a switch network 210 configured to selectively couple the output of each current generator 206 to either a single test output 212 common to all of the output current generators 206 of the same output current stage 202 or to a bias current-specific output that in turn is electrically coupled to an input of a corresponding circuit block 104.

For example, in the illustrated embodiment, a pair of switches 214 and 216 is implemented at the output of each output current stage 202. The switches 214, 216 may be implemented using, for example, a set of one or more transistors. Switch 214 has one terminal connected to the output of the output current stage 202 and another terminal connected to the test output 212 and switch 216 has one terminal connected to the output of the output current stage 202 and another terminal connected to a corresponding output for providing the resulting bias current to the corresponding circuit block 104. Each of switches 214 and 216 further includes a switch control input to receive a respective switch control signal that causes the corresponding switch to selectively "open" or "close" the corresponding switch; that is, to render the corresponding switch either non-conductive or conductive, respectively, between its two terminals. Thus, when switch 214 is open and switch 216 is closed, the output bias current from the corresponding output current generator 206 is routed from the output current stage 202 to the corresponding circuit block 104, whereas when switch 214 is closed and switch 216 is open, the output bias current is instead routed to the test output 212. The switch control inputs to the switch network 210 of a given output current stage 202 are identified using the designators "SWX_T" and "SWX_F", respectively, with "X" identifying the output current generator 206 having an output connected to the switch pair, "T" referencing "test" or "trimming" depending on mode, and "F" representing "functional". Thus, SW1_T and SW1_F identifies the switch control inputs to the switches 214 and 216, respectively, at the output of the current generator 206-1, SW2_T and SW2_F identifies the switch control inputs to the switches 214 and 216, respectively, at the output of the current generator 206-2, and so forth.

Table 1 below illustrates a general configuration of the switch states for the switch network 210 depending on one of three modes: trimming; safety check; and functional. The trimming mode represents the configuration employed for the switch network 210 while the IC device 100 is being produced, a process which typically includes trimming the voltage-based current generators 206 due to production variations. The safety check mode represents the configuration employed for the switch network 210 for performing testing/validation of the bias generator 102 while in the field; and the functional mode represents the configuration employed for the switch network 210 while the IC device 100 is operational/functioning in the field (that is, when not being tested).

TABLE 1

| MODE | SWX_T | SWX_F | NOTE |
|---|---|---|---|
| Trimming | ON | OFF | During production test for |
| | (closed) | (open) | trimming, etc. - current sent to ATB 128 |
| Safety Check | ON (closed) | OFF (open) | During test/validation while in field - current sent to ATB 128 |
| Functional | OFF (open) | ON (closed) | During operation in field - current sent to circuit block 104 |

Note that although FIG. 1 illustrates one example of the switch network 210 for selectively routing generated output currents to either the test output 212 or to a corresponding circuit block 104, any of a variety of switching configurations may be employed in switch network 210 for these purposes.

As noted above, each output current stage 202 includes one or more current generators 206 that generates a corresponding current based on the drive voltage received at the input 204 of the output current stage 202. In at least one embodiment, each output current stage 202 receives a separate drive voltage, which may be generated as a particular type of reference voltage, such as a temperature-independent voltage, CTAT voltage, or PTAT voltage, and also may have its own slope, so that the bias currents generated by the plurality of output current stages 202 have different slopes and modes/types, and thus may provide for reduced bias current sensitivities for PVT variations. In the example of FIG. 2, these drive voltages of different types and slopes are generated using a bandgap module 217 and a plurality of drive voltage generators 218, such as the illustrated drive voltage generators 218-1 (drive voltage generator 1) and 218-2 (drive voltage generator 2). The bandgap module 217 generates a reference voltage 220 (VREF) that is intended to not vary in response to changes in temperature and a PTAT reference bias current 222 (IBIAS_PTAT) that is intended to be PTAT. One or both references are provided to each drive voltage generator 218, which in turn generates, from the input one or both of VREF and/or IBIAS_PTAT, a corresponding drive voltage 224 that is provided to the voltage input 204 of a corresponding output current stage 202. Each drive voltage generator 218 is configured to provide a separate slope response (or a flat temperature-independent response) and thus provide a drive voltage with a different temperature slope or temperature coefficient (that is, slope relative to temperature). For example, drive voltage generator 218-1 may generate a drive voltage 224-1 (Vd1) with one PTAT slope while drive voltage generator 218-2 may generate a drive voltage 224-2 (Vd2) with a different PTAT slope. Alternatively, these drive voltage generators 218-1 and 218-2, or other drive voltage generators 218 (not shown), may, for example, generate a temperature-independent drive voltage, a CTAT drive voltage with one slope and another CTAT drive voltage with a different slope, and the like. Thus the plurality of drive voltage generators 218 provide a set of drive voltages with different slopes (including no slope, or flat) to the different output current generators 202 of the bias generator 102. Any of a variety of circuits and combinations thereof may be employed for the drive voltage generators 218, such as a voltage-to-current circuit, diode circuits, and the like. Although one approach to supplying different drive voltages to the output current stages 202 is illustrated, it will be appreciated that the bias generator 102 can utilize any of a variety of approaches for providing such drive voltages.

The test outputs 212 of the plurality of output current stages 202, the drive voltage outputs of the drive voltage generators 218, and the output reference currents of the bandgap module 217 are connected to respective inputs of an ATB interface (IF) 226, which in turn has an output connected to a conductive line 228 of the ATB 128. The ATB interface 226 further includes an input to receive control signaling that configures the ATB interface 226 to selectively connect one or more of its inputs to its output. That is, the ATB interface 226 acts as an analog multiplexer or switch network to selectively provide either a test voltage (representing one of the drive voltages 224) or a test current (representing one or more of the bias currents 208 generated by one or more output current stages 202) for transmission to the testing module 106 over the ATB 128 via line 228, depending on the configuration of the received control signaling.

In the depicted example, the testing module 106 includes a safety monitor 230 and a microcontroller unit (MCU) 232. The safety monitor 230 has an input 234 conductively connected to the line 228 of the ATB 128, a variable, or programmable, resistor 236 selectively coupleable to the input 234 via a switch 238, and an analog-to-digital converter (ADC) 240 having an input coupled to the input 234. The variable resistor 236 can be implemented as, for example, a variable resistor ladder (e.g., a circuit of resistors and corresponding switches that can be controlled to provide an equivalent resistance) or other digitally-controlled potentiometer. The MCU 232 is implemented as hardcoded logic, programmable logic, one or more processors executing software, or a combination thereof, and operates to control/configure the bias generator 102 and safety monitor 230 for testing and to analyze the test results for purposes of selectively asserting the flag 124. Accordingly, the MCU 232 has an input coupled to the output of the ADC 240 and an output to selectively assert the flag 124. The MCU 232 further has an output to provide control signaling 242 for the safety monitor 230 and the bias generator 102, including the control signaling for controlling the switch networks 210 of the output current stages 202, the control signaling for controlling the ATB interface 226, the control signaling for programming the variable resistor 236, and the control signaling for controlling the switch 238 of the safety monitor 230, and the like. Note that the switch 238 can either be one or more switches separate from the variable resistor 236, or the functionality of the switch 238 can be implemented through the variable resistor 236, such as controlling the internal switches of the variable resistor 236 such that the variable resistor 236 presents either a low impedance (i.e., "closing" the switch 238) or a high impedance (i.e., "opening" the switch 238) to the input of the ADC 240.

As a general operational overview, either a voltage to be tested (a test voltage) or a current to be tested (a test current) is received at the input 234 of the safety monitor from the bias generator 102 via the ATB interface 226 through corresponding configuration of the ATB IF 226 and the switch networks 210 via control signaling 242 provided by the MCU 232. In the event that a voltage is being tested, the control signaling 242 is configured to open the switch 238, such that the test voltage is received at the input of the ADC 240, which in turn converts the test voltage to a corresponding digital value 244, which is then output to the MCU 232. In the event that a current is being tested, the control signaling 242 is configured to close the switch 238 so that the test current received via input 234 is routed through the variable resistor 236 and thereby generating a test voltage across the variable resistor 236 that is then converted by the ADC 240 to a corresponding digital value 244 that is then output to the MCU 232. The MCU 232 then uses the received digital value 244 to determine whether the test voltage or test current represented by the received digital value 244 is within an acceptable operating range.

This determination can be made by, for example, comparing the digital value 244 (or a modified representation thereof) to an expected digital value for the corresponding voltage or current being tested, and if the digital value 244 is within a specified threshold of the expected digital value, the voltage or current being tested is considered to be within an acceptable operating range. Otherwise, if the digital value 244 differs from the expected digital value by more than the specified threshold, the voltage or current being tested is considered to be outside an acceptable operating range. Alternatively, an acceptable digital value range can be specified, or a look-up table (LUT) or other data structure can be programmed with digital values and their corresponding within/outside of acceptable range statuses specified. To this end, the MCU 232 can employ a memory, cache, or other data storage 246 to store such expected values, specified thresholds, ranges, and the like.

In the event that the MCU 232 determines that the digital value 244 indicates that the voltage or current being tested is within an acceptable operating range, the MCU 232 maintains the flag 124 in an unasserted state. Conversely, if the MCU 232 determines that the digital value 244 indicates that the voltage or current being tested is outside of the acceptable operating range, the MCU 232 asserts the flag 124 (that is, puts the flag 124 in an asserted state). The flag 124 also may be configured with additional information indicating the cause of the asserted flag 124, such as a code identifying which voltage or current being tested resulted in the assertion of the flag 124. As described in greater detail below, the FCCU 108 or other component of the IC device 100 then evaluates the asserted flag 124 in conjunction with other information in deciding whether to trigger an error 126 that may lead to cessation of operation of certain functions of the IC device 100 or may lead to some corrective action to address the faulty operation of the bias generator 102 for the next phase of operation.

Figure 3:
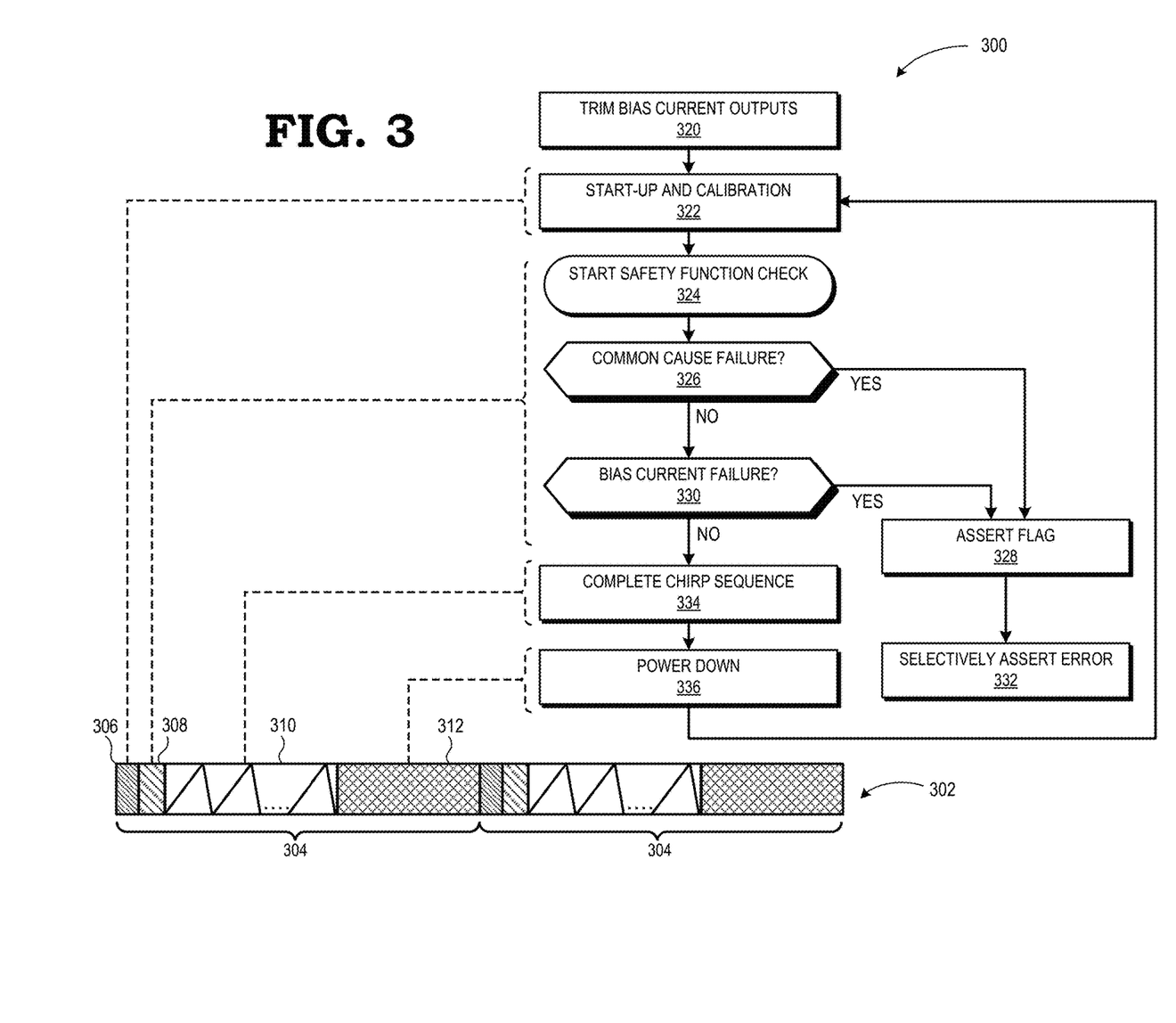
FIG. 3 is a flow diagram illustrating a two-stage bias generator testing process in accordance with some embodiments.

FIG. 3 illustrates a method 300 of operation of the IC device 100 that includes a two-stage bias generator testing process in accordance with some embodiments. To facilitate understanding, the method 300 is described in an example context in which the IC device 100 implements an automotive radar function. As illustrated by timing diagram 302, the IC device 100 repeats an operational cycle 304 that sequences through a startup/calibration stage 306, a safety test stage 308, an operational chirp stage 310, and then a power down stage 312. The next operational cycle 304 then starts with the startup/calibration stage 306, and so forth.

However, prior to in-field operation, the IC device 100 first must be produced. As represented by block 320, during the production process the bias currents of the bias generator 102 of the IC device 100 are tested using the testing module 106 and the output current generators 206 of the bias generator 102 are trimmed so as to bring the generated bias currents into an acceptable operating range. In one embodiment, this trimming process includes, for each current generator 206 to be tested, the MCU 232 programming the variable resistor 236 to a specified resistance, the MCU 232 programming the switch networks 210 and the ATB interface 226 via control signaling to send the bias current generated by each current generator 206 to the test input 234 of the safety monitor 230 via the ATB interface 226 and the ATB 128, the MCU 232 configuring the switch 238 via control signaling to directing the received bias current through the variable resistor 236, and then, based on the digital value 244 generated by the ADC 240 from on the voltage across the variable resistor 236, determining whether to trim the corresponding current by trimming the current generator 206, retesting the resulting trimmed bias current, and repeating the test/trim process until a suitable bias current is generated. This process then may be repeated in sequence for some or all of the current generators 206, with the resulting trimming code representing the trimming to be employed for the current generators 206 stored in a one-time-programmable (OTP) memory or other non-volatile storage element associated with the bias generator 102.

Post-production, the IC device 100 is integrated into a larger electronic system (e.g., an automotive electronics suite) that is then deployed in the field. When operational in-field, as mentioned above the IC device 100, in the example implementation, performs a series of operational cycles 304 to provide radar sensing functionality. The operational cycle 304 initiates with the startup/calibration stage 306 (represented by block 322 of FIG. 3), in which the IC device 100 performs a start-up and calibration sequence in preparation for performing radar sensing operations. As part of this sequence, the IC device 100 may read the trimming code stored during production and trim the current generators 206 of the bias generator 102 accordingly.

After the start-up/calibration stage 306 is complete, the operational cycle 304 initiates (at block 324) the safety test stage 308 in which a safety function check of various designated mission-critical or safety-critical components of the IC device 100 is performed. As part of this safety function check, the bias generator 102 may be tested via a two-stage test process. The two stages of this test process include a common cause failure test followed by a grouping-based bias current test. Accordingly, at block 326 the IC device 100 performs the common cause failure test. This test involves testing for the more common causes of failure of the bias generator 102 using the shared ATB 128 and testing module 106.

For example, in the example implementation of FIG. 2 it is assumed that failure of the bandgap module 217 and plurality of drive voltage generators 218 to generate one or more drive voltages 224 within an acceptable operating range is the most likely point or cause of failure for the bias generator 102. Accordingly, the testing module 106 coordinates with the bias generator 102 to sequentially test some or all of the drive voltages 224 via the ATB 128. In this approach, the MCU 232 configures the control signaling provided to the ATB interface 226 to sequentially output each of the drive voltages 224 in turn to the ATB 128. For each drive voltage 224 thus output, the MCU 232 configures the switch 238 to an open, or non-conductive state, so that the drive voltage 224 is received at the test input 234 and then conducted to the input of the ADC 240, whereupon the ADC 240 converts the input drive voltage 224 to a corresponding digital value 244. The MCU 232 then uses this digital value 244 to determine whether the drive voltage 224 is within an acceptable operating range, such as by determining whether a difference between the digital value 244 and an expected digital value is within a specified threshold, or whether the digital value 244 falls within a specified range of digital values.

If the MCU 232 determines at block 326 that a tested drive voltage is outside of a corresponding acceptable operating range, then at block 328 the MCU 232 asserts the flag 124 at block 328. The assertion of the flag 124 can include the provision of a code or other indicator of the cause of the flag 124, including an identifier of the drive voltage that failed the test. Otherwise, if all tested drive voltages are found to be within their corresponding acceptable operating ranges, then the IC device 100 concludes the common cause failure test stage and can proceed to the grouping-based bias current test represented by block 330.

Figure 4:
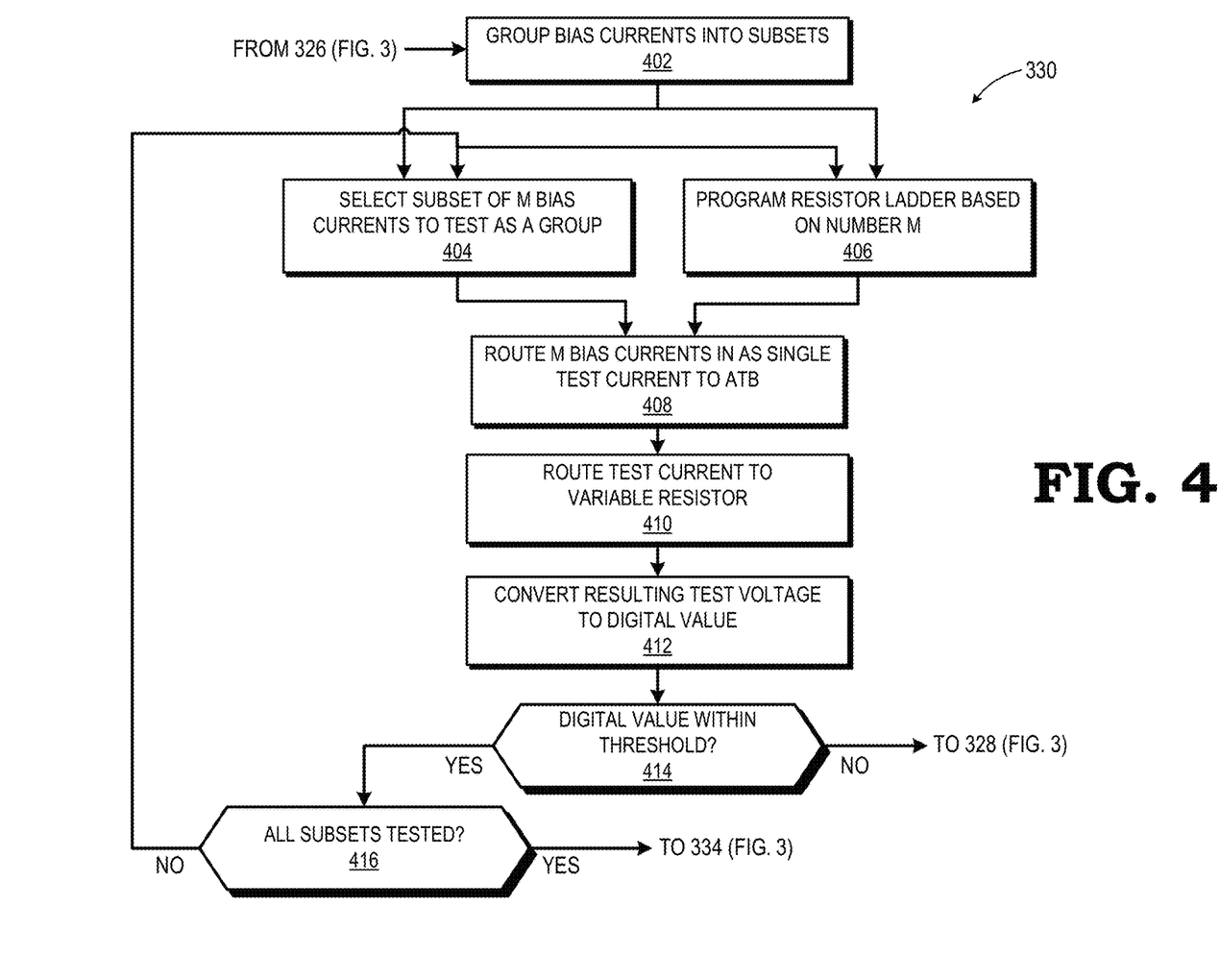
FIG. 4 is a flow diagram illustrating a bias current testing subprocess of the testing process of FIG. 3 in accordance with some embodiments.
Figure 5:
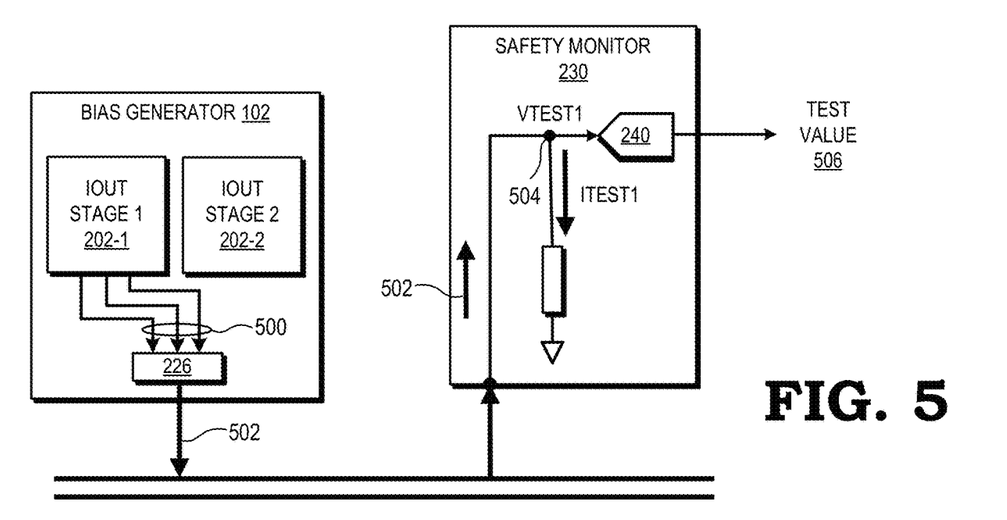
FIG. 5 is a diagram illustrating an example of the bias current testing process of FIG. 4 in accordance with some embodiments.
Figure 6:
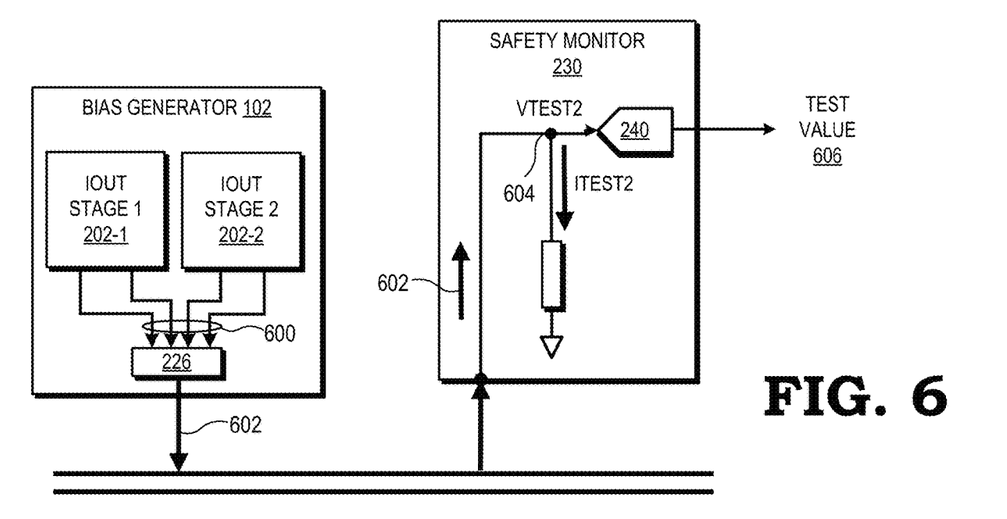
FIG. 6 is a diagram illustrating another example of the bias current testing process of FIG. 4 in accordance with some embodiments.

Referring briefly to FIGS. 4-6, an implementation of the grouping-based bias current test of block 330, as well as examples thereof, are illustrated in accordance with some embodiments. As shown by FIG. 4, the grouping-based bias current test initiates at block 402 with the MCU 232 grouping of the plurality of bias currents 208 generated by the bias generator 102 for testing purposes into a plurality of subsets. Each subset includes one or more bias currents 208, with at least some or all of the subsets including two or more bias currents 208. In some embodiments, the subsets are mutually exclusive, whereas in other embodiments there may be overlap between subsets (that is, a bias current 208 may be grouped into more than one subset). The number of bias currents 208 per subset may be constant, while some subsets may have more bias currents than others. The grouping may be based on the output current stages 202. For example, a given subset may contain only those bias currents 208 generated by the same output current stage 202. Alternatively, the grouping may span multiple output current stages 202, such that a subset may contain bias currents 208 from different output current stages. As described in greater detail below, the number of subsets, and thus the size of the subsets, may be selected based on any of a variety of considerations. Generally, the smaller the subsets, and thus the larger total number of subsets, the longer the sequential testing of subsets will take, but with improved testing resolution. Conversely, a smaller number of subsets, and thus a larger number of bias currents 208 per subset, will result in faster testing of the sequence of subsets, but at the expense of testing resolution.

Moreover, the grouping may be predetermined and fixed, or the grouping may be determined ad hoc. For example, for a given operational mode the bias generator 102 may be configured to provide a predetermined number of bias currents 208 and the IC device 100 has a predetermined amount of time to perform the safety function test, and thus the MCU 232 may be configured to implement a predetermined grouping of the bias currents 208 into corresponding subsets based on this information. In other instances, the number of bias currents 208 to be employed in a given mode may vary, or the amount of time allocated to conduct bias generator testing may vary, and the MCU 232 in such situations can instead vary the number/size of the subsets based on these varying considerations.

Whether employing a fixed or ad hoc grouping, the bias current testing process involves testing of the plurality of subsets in sequence. Accordingly, at block 404 the MCU 232 selects the next (or initial) subset of M bias currents 208 to be tested, wherein M is greater than or equal to one. Concurrently, at block 406 the MCU 232 programs the variable resistor 236 to have a specified resistance Ratb based on the number M of bias currents 208 included in the selected subset. It will be appreciated that the ADC 240 utilized to convert the voltage across the variable resistor 236 (Vres) to a corresponding digital value 244 may have a particular input voltage operating range, and thus the specified resistance Ratb is programmed based on the expected input test current (which is the combination of the M bias currents 208 in the subset selected for testing) and this input voltage operating range. For example, because the voltage Vres is a product of the test current (Itest) and the programmed resistance Ratb (that is, Vres=Itest*Ratb), the programmed resistance Ratb can be configured to have an inversely proportional relationship to the number M of bias currents 208 being tested as a group. In particular, in some embodiments, the resistance Ratb is set as Ratb≈Rmax/M, wherein Rmax represents either a maximum programmable resistance of the variable resistor 236 or some other specified maximum resistance value.

With a subset of bias currents 208 selected and the variable resistor 236 programmed accordingly, at block 408 the bias currents of the selected subset are combined as a single test current and the test current is routed from the bias generator 102 to the test input 234 of the testing module 106 via the ATB 128. To illustrate using the example implementation of FIG. 2, the MCU 232 configures the switch networks 210 of the output current stages 202 to route the bias currents 208 of the selected subset to the ATB interface 226 via the test outputs 212 of the corresponding output current stage(s) 202 by, for example, closing the switch 214 and opening the switch 216 for each current generator 206 that provides a bias current 208 included in the subset while opening the switch 214 and closing the switch 216 for each current generator that provides a bias current 208 not included in the subset. The MCU 232 also configures the ATB interface 226 to output each of the received bias currents 208 of the subset in parallel to the line 228 of the ATB 128, thereby forming a single test current from the combined parallel output of the M separate bias currents 208 onto the line 228 from the ATB interface 226. At block 410, this single test current representing the combination, or sum, of the M individual bias currents 208 is conducted over the ATB 128 to the test input 234 of the safety monitor 230, and the MCU 232 configures the switch 238 into a closed state, thereby causing the test current (Itest) to pass through the variable resistor 236, causing a voltage Vtest to form across the variable resistor 236 having the programmed resistance Ratb, where Vtest=Ratb*Itest.

At block 412, the resulting test voltage Vtest is converted to a digital value (digital value 244) by the ADC 240, and the digital value is provided to the MCU 232 At block 414, the MCU 232 evaluates, using a software-based process or hardware-based comparator, the digital value to determine whether the subset of bias currents 208 is within a corresponding acceptable operating range. As noted, this determination may be made based on a comparison of the digital value to an expected digital value in view of a specified threshold, comparison of the digital value to a corresponding range, performing a lookup using the digital value into a LUT, and the like. It will be appreciated that this evaluation is based on an averaging, or cumulative, expected operational range for the entire subset as the test current Itest represents the combination of all bias currents 208 in the subset. To illustrate, assume that there are eight bias currents 208 (M=8) in the subset and each bias current 208 is expected to be approximately 4 microamperes (uA) at the operating temperature of the bias generator 102 under test, with an acceptable operating range of 3.98 to 4.02 uA for each of these bias currents 208. As such, the total test current Itest when each bias current 208 is within an acceptable operational range would range between 31.84 uA and 32.16 uA, with a nominal expected value of 32 uA. This range then can be slightly narrowed to exclude the statistically unlikely scenarios in which all eight bias currents 208 are operating at 3.98 uA or all eight bias currents are operating at 4.02 uA, arriving at a narrower range of, for example, 31.9-32.1 uA, or 32+/−0.1 uA. Thus, if a digital value representing a value within this range, or within a +/−0.1 uA threshold of 32 uA is received, the MCU 232 determines that each of the bias currents 208 within the subset are within an acceptable operating range. However, if a digital value representing a value outside this range, or outside of a +/−0.1 uA threshold of 32 uA, is received, the MCU 232 determines that at least one of the bias currents 208 within the subset is outside of an acceptable operating range. Note that although this example is described in terms of current, it will be appreciated that the testing is performed based on a digital representation of the voltage measured by the ADC 240 as a result of the test current and the resistance Ratb (that is, Vtest=Itest*Ratb), and thus the actual test values, ranges, and thresholds in implementation would be understood to be the voltage-equivalent counterparts based on the Ratb employed.

Thus, if at block 414 the digital value indicates that the test current Itest (=Vtest/Ratb) representing the combination of the M bias currents 208 of the subset is outside of an acceptable operating range, then the method 300 transitions from the testing process of block 330 to asserting a flag 124 at block 328 (FIG. 3). As similarly explained above, the assertion of this flag 124 can include an indicator of the cause or trigger of the flag 124, such as an identifier of the subset of bias currents 208 that failed the grouped bias current test. However, if at block 414 the digital value indicates that the test current Itest is within an acceptable operating range, then the bias currents 208 of the subset are deemed to be in compliance and no flag 124 is asserted. At block 416 the MCU 232 determines whether there are any subsets remaining that have not yet been tested. If so, the method 300 returns to blocks 404 and 406 for another iteration of the grouping-based bias current test represented by blocks 404 to 416 for the next subset in the sequence of subsets. Otherwise, if the MCU 232 determines at block 416 that all subsets have been tested (and no flags have been triggered during the testing of a subset), then the test process of block 330 concludes.

FIGS. 5 and 6 illustrate two example scenarios for the grouping-based bias current testing process of block 330 for corresponding subsets. In the example of FIG. 5, a subset 500 of three bias currents (M=3) from the output current stage 202-1 is selected for testing. Accordingly, the variable resistor 236 is programmed to a value Rtest1=Rmax/3 and the output current stage 202-1 is configured to output the three selected bias currents to the ATB interface 226 in parallel. The ATB 226 outputs these three bias currents in combination as a test current 502 (Itest1) to the ATB 128. The test current 502 thus is conducted to the safety monitor 230 via the ATB 128, and from there is conducted through the variable resistor 236, resulting in the generation of a test voltage 504 (Vtest1=Itest1*Rtest1) at the input to the ADC 240. The ADC 240 converts the test voltage 504 to a corresponding digital value 506, which is then evaluated by the MCU 232 to determine whether the test current 502 is within an acceptable operating range, and thus whether the three bias currents that constitute the test current 502 are presumably individually within their own acceptable operating ranges.

In the example of FIG. 6, a subset 600 of four bias currents (M=4) from both the output current stage 202-1 and the output current stage 202-2 is selected for testing. Accordingly, the variable resistor 236 is programmed to a value Rtest2=Rmax/4 and the output current stages 202-1 and 202-2 are configured to output the four selected bias currents to the ATB interface 226 in parallel. The ATB 226 outputs these four bias currents in combination as a test current 602 (Itest2) to the ATB 128. The test current 602 is conducted to the safety monitor 230 via the ATB 128, and from there is conducted through the variable resistor 236, resulting in generation of a test voltage 604 (Vtest2=Itest2*Rtest2) at the input to the ADC 240. The ADC 240 converts the test voltage 604 to a corresponding digital value 606, which is then evaluated by the MCU 232 to determine whether the test current 602 is within an acceptable operating range, and thus whether the four bias currents that constitute the test current 602 are presumably individually within their own acceptable operating ranges.

Returning to FIG. 3, as explained the grouping-based bias current test process of block 330 results in either a failed test status due to the test current formed from a subset of bias currents falling outside of an acceptable range or a passed test status in which the test current for every tested subset is within a corresponding acceptable range. In the event of the failed test status, at block 328 the MCU 232 asserts a flag 124 to signal the failed test status. Thus, as described above, a flag 124 may be asserted during the first stage of testing for the common cause failure testing of block 326 or, if no flag is asserted during the first state, during the second stage of testing using grouped bias current testing. In either case, in response to the assertion of a flag 124 at block 328, the FCCU 108 (FIG. 1) evaluates the asserted flag 124 and associated circumstances at block 332 for selectively triggering an error 126 that could in turn trigger deactivation of the bias generator 102 and some or all of the circuitry of the IC device 100 reliant on the bias currents 208 generated therefrom. Such circumstances may include, for example, the priority of the circuitry impacted by the bias generator 102 operating outside an acceptable margin of error, the cause of the flag 124 (e.g., a failed drive voltage vs. a failed bias current), the degree to which the failed voltage/current being tested deviated from the expected value, and the like.

However, in the event that a flag 124 is not asserted at both stages of the two-stage bias generator test performed as part of the safety test stage 308, any other safety tests that have not yet been performed can be performed, and then the operational cycle 304 enters the operational chirp stage 310 of the operational cycle 304. As represented by block 334, this operational chirp stage 310 can include the operation, or performance, of one or more radar functions using the circuit blocks 104 that utilize the bias currents 208 from the now-verified bias generator 102, such as the radio frequency (RF) transmission of one or more radar chirps and receipt and processing of any reflected RF signals for object detection. Following the operational chirp stage 310, the operational cycle 304 enters the power down stage 312 (represented by block 336), during which the IC device 100 shuts down and gates off certain circuitry so as to conserve power and reduce wear. In this example, the end of the power down stage 312 marks the end of the current operational cycle 304, and the next operational cycle 304 then starts with another iteration of the startup/calibration stage 306, and another iteration of the process of blocks 322-336 begins.

Note that although FIG. 3 illustrates a particular arrangement of the safety test stage 308 relative to the other stages of the operational cycle 304, in other embodiments some of these stages may be implemented in a different order. For example, rather than implement the safety test stage 308, and thus the two-stage bias generator test process, prior to the operational chirp stage 310, in other embodiments, the operational chirp stage 310 is performed first, and then the safety test stage 308 is performed following the operational chirp stage 310. In this order, any date or results from the operational chirp stage 310 are temporarily buffer and remain unused for downstream processing until the safety test stage 308 is completed and confirms that the bias generator 102 and other tested components of the IC device 100 are operating within acceptable ranges and therefore the results and data generated by these tested components can be trusted.

The operational cycle 304 of FIG. 3 illustrates an example of the utility of the grouping-based bias generator testing process. Ideally, either the operational cycle 304 is kept as short as practicable so as to permit more iterations of the operational cycle 304 per unit time or the duration of the stages other than the operational chirp stage 310 are kept as short as practicable to permit the operational chirp stage 310 to be longer for a given duration of the operational cycle 304. Thus, a reduction in the time needed to perform the safety test stage 308 can increase the overall effectiveness or efficiency of the IC device 100 in performing its associated radar functions. The grouping of the bias currents into subsets for testing together as a single test current requires fewer current tests compared to conventional individual bias current test processes, and thus facilitates reduction of the overall time needed to perform the safety test stage.

To illustrate, assume an IC device with two different PTAT slopes and 200 bias currents, each of 20 uA. If a test resistor of Rmax=50 kilohms (kΩ) is used, each such bias current would result in an expected test voltage of 1 volt (V) (50 Ω*20 uA). A 10% error in a given current would be +/−100 mV, which is detectable by most built-in self-test (BIST)-type ADCs. Further assume that the time to test each of these bias currents is 2 microseconds (us), including program, settle, and measure times. A conventional bias current test process in which each bias current is tested individually and in sequence would thus require approximately 404 us to complete (400 us to test the bias currents individually and 4 us to test the drive voltages). Now assume a grouping-based test as described above, where the 200 bias currents are grouped in subsets of 10 bias currents each (M=10), resulting in 20 subsets to be tested, each subset having an expected combined test current of 200 uA (20 uA*10 bias currents). Assuming the same Rmax as the above conventional scenario, the resulting Rtest is 5 kΩ, and thus resulting in an expected test voltage Vtest of 1V (5 kΩ*200 uA test current). A 10% deviation in one of the 10 bias currents thus is reflected in a 10 mV deviation in the test voltage Vtest, which is a value that is still detectable by many common BIST ADC implementations. However, using the same time to test a subset of 10 bias currents as a single test current of 2 us, testing the 20 subsets would take only 44 us (40 us to test the 20 subsets and 4 us to test the two drive voltages). This represents a nearly 10-fold reduction in the time to test the bias generator, and frees up 360 us to either shorten the overall operational cycle 304 or expand the operational chirp stage 310 if the duration of the operational cycle is fixed. Alternatively, for a given safety test duration, additional testing can be performed, or a combination of increased testing and increased operational time can be achieved.

In some embodiments, certain aspects of the techniques described above may be implemented by one or more processors of a processing system executing software. The software comprises one or more sets of executable instructions stored or otherwise tangibly embodied on a non-transitory computer-readable storage medium. The software can include the instructions and certain data that, when executed by the one or more processors, manipulate the one or more processors to perform one or more aspects of the techniques described above. The non-transitory computer-readable storage medium can include, for example, a magnetic or optical disk storage device, solid-state storage devices such as Flash memory, a cache, random access memory (RAM) or other non-volatile memory device or devices, and the like. The executable instructions stored on the non-transitory computer-readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A device comprising:
    a bias generator configured to generate a plurality of bias currents; and
    a testing module including a variable resistor, the testing module configured to test the bias generator by successively testing each subset of bias currents of a plurality of subsets of bias currents grouped from the plurality of bias currents as a corresponding single test current, the testing module to test the bias generator by configuring the variable resistor to have a corresponding resistance based on the number of bias currents represented in the subset.

2. The device of claim 1,
    wherein the testing module is configured to test the bias generator by:
        for each subset of bias currents:
            conducting a corresponding test current through the variable resistor configured to the corresponding resistance, the test current representing a combination of all bias currents of the corresponding subset; and
            determining a test status for the subset of bias currents based on a voltage across the variable resistor resulting from conducting the corresponding test current.

3. The device of claim 2, wherein the testing module is configured to determine a test status for the subset of bias currents by:
    converting the voltage across the variable resistor to a corresponding test digital value; and
    determining the test status based on a comparison of the test digital value with at least one of a predetermined digital value or a predetermined range of values.

4. The device of claim 3, wherein the testing module is configured to determine a test status for the subset of bias currents further by identifying a failed test status responsive to at least one of the test digital value differing from the predetermined digital value by more than a specified threshold or the test digital value falling outside the predetermined range.

5. The device of claim 1, wherein the testing module is configured to configure the variable resistor to have a corresponding resistance by configuring the variable resistor to have a resistance inversely proportional to the number of bias currents in the subset.

6. The device of claim 2, further comprising a conductive bus coupling the bias generator to the variable resistor, and wherein:
    the bias generator is configured to generate the plurality of bias currents based on a plurality of drive voltages; and
    wherein the testing module is further configured to test the bias generator by:
        for each drive voltage of at least a subset of the plurality of drive voltages:
            receiving the drive voltage over the conductive bus at an input of an analog-to-digital converter (ADC) of the testing module;
            converting the provided drive voltage at the ADC to a corresponding test digital value; and
            determining a test status of the bias generator based on a comparison of the test digital value to a predetermined digital value.

7. The device of claim 1, wherein each subset has the same number of bias currents.

8. The device of claim 1, wherein at least one subset has a different number of bias currents than another subset.

9. A method comprising:
    grouping a plurality of bias currents generated by a bias generator into a plurality of subsets, at least one subset having two or more bias currents of the plurality of bias currents; and
    testing the bias generator by successively testing each subset of bias currents as a corresponding single test bias current, wherein testing the bias generator comprises:
        configuring a variable resistor to have a corresponding resistance based on the number of bias currents represented in the subset;
        providing a corresponding test current to the variable resistor configured to the corresponding resistance, the test current representing a combination of all bias currents of the corresponding subset; and
        determining a test status for the subset of bias currents based on a voltage across the variable resistor resulting from conducting the corresponding test current.

10. The method of claim 9, wherein determining the test status for the subset of bias currents comprises:
    converting the voltage across the variable resistor to a corresponding test digital value; and
    determining the test status based on a comparison of the test digital value with at least one of a predetermined digital value or a predetermined range of digital values.

11. The method of claim 10, wherein determining the test status for the subset of bias currents further comprises:
    identifying a failed test status responsive to at least one of the test digital value differing from the predetermined digital value by more than a specified threshold or exceeding the test digital value falling outside the predetermined range.

12. The method of claim 9, wherein configuring the variable resistor to have a corresponding resistance comprises:
    configuring the variable resistor to have a resistance inversely proportional to the number of bias currents in the subset.

13. The method of claim 9, wherein conducting the corresponding test current through the variable resistor comprises conducting the corresponding test current from the bias generator to the variable resistor over a conductive bus used for other testing processes for a system having the bias generator.

14. The method of claim 13, further comprising:
    generating the plurality of bias currents based on a plurality of drive voltages; and
    testing the bias generator further by:
        for each drive voltage of at least a subset of the plurality of drive voltages:
            providing the drive voltage over the conductive bus to an input of an analog-to-digital converter (ADC);
            converting the provided drive voltage at the ADC to a corresponding test digital value; and
            determining a test status of the bias generator based on a comparison of the test digital value to at least one of predetermined digital value or a predetermined range of values.

15. A non-transitory computer-readable medium storing machine instructions which, when executed by at least one processor, cause the at least one processor to:
    group a plurality of bias currents generated by a bias generator into a plurality of subsets, at least one subset having two or more bias currents of the plurality of bias currents;
    test the bias generator by successively testing each subset of bias currents as a corresponding single test bias current; and
    configure a variable resistor to have a corresponding resistance based on a number of bias currents represented in the subset.

16. The non-transitory computer-readable medium of claim 15, wherein the machine instructions to test the bias generator comprise machine instructions to:
    for each subset of bias currents:
        provide a corresponding test current to the variable resistor configured to the corresponding resistance, the test current representing a combination of all bias currents of the corresponding subset; and
        determine a test status for the subset of bias currents based on a voltage across the variable resistor resulting from conducting the corresponding test current.

17. The non-transitory computer-readable medium of claim 16, wherein the machine instructions to determine the test status for the subset of bias currents comprise machine instructions to:
    convert the voltage across the variable resistor to a corresponding test digital value; and
    determine the test status based on a comparison of the test digital value with at least one of a predetermined digital value or a predetermined range of digital values.

18. The non-transitory computer-readable medium of claim 17, wherein the machine instructions to determine the test status for the subset of bias currents further comprise machine instructions to:
    identify a failed test status responsive to at least one of the test digital value differing from the predetermined digital value by more than a specified threshold or exceeding the test digital value falling outside the predetermined range.

19. The non-transitory computer-readable medium of claim 15, wherein the machine instructions to configure the variable resistor to have a corresponding resistance comprises machine instructions to configure the variable resistor to have a resistance inversely proportional to the number of bias currents in the subset.

* * * * *